(12) United States Patent
Santos

(10) Patent No.: US 11,157,790 B1
(45) Date of Patent: Oct. 26, 2021

(54) SYSTEM AND METHOD FOR TRANSFERRING AN EMV CHIP FROM A FIRST CARD TO A SECOND CARD

(71) Applicant: Andre Santos, Woodbridge (CA)

(72) Inventor: Andre Santos, Woodbridge (CA)

(73) Assignees: Christian Smilynov, Woodbridge (CA); Andre Santos, Woodbridge (CA)

( * ) Notice: Subject to any disclaimer, the term of this patent is extended or adjusted under 35 U.S.C. 154(b) by 0 days.

(21) Appl. No.: 17/007,833

(22) Filed: Aug. 31, 2020

(51) Int. Cl.
*G06K 19/077* (2006.01)

(52) U.S. Cl.
CPC .............................. *G06K 19/07745* (2013.01)

(58) Field of Classification Search
CPC ................................................ G06K 19/07745
USPC .................................................. 235/492, 487
See application file for complete search history.

(56) References Cited

U.S. PATENT DOCUMENTS

| | | | | |
|---|---|---|---|---|
| 4,947,531 A | * | 8/1990 | Brisson | G06K 19/07745 29/446 |
| 5,508,107 A | * | 4/1996 | Gutman | C09J 7/385 428/339 |
| 5,581,065 A | * | 12/1996 | Nishikawa | G06K 19/072 235/487 |
| 5,677,524 A | * | 10/1997 | Haghiri-Tehrani | G06K 19/077 235/487 |
| 5,975,584 A | * | 11/1999 | Vogt | G06K 13/077 283/100 |
| 2008/0206520 A1 | * | 8/2008 | Il | C23C 26/00 428/172 |
| 2011/0315779 A1 | * | 12/2011 | Bidin | H01L 23/49855 235/492 |
| 2019/0010613 A1 | * | 1/2019 | Shoji | C23C 2/40 |
| 2019/0272457 A1 | * | 9/2019 | Vu | G06K 19/0772 |

\* cited by examiner

*Primary Examiner* — Allyson N Trail

(57) ABSTRACT

A method for transferring an EMV chip from a first card to a second card, the method comprising the steps of: heating a first body of the first card in a vicinity of the EMV chip so as to weaken adhesion of the EMV chip with a first receptacle of the first body; bending a first body surface of the first body adjacent to the EMV chip, such that first body surface becomes non parallel with a metal contact surface of the EMV chip; removing the EMV chip from the first receptacle; positioning an applied adhesive between a back surface of the EMV chip and an opposing surface of a second receptacle of the second card, the second receptacle in a second body of the second card; and maintaining the EMV chip in the second receptacle until the applied adhesive has cured.

13 Claims, 5 Drawing Sheets

SYSTEM AND METHOD FOR TRANSFERRING AN EMV CHIP FROM A FIRST CARD TO A SECOND CARD

FIELD

The present invention is related to EMV chips of credit/debit cards.

BACKGROUND

Credit cards and debit cards were originally developed using a magnetic stripe or mechanical imprint to read and record account data, with the customer's signature being used for verification. Under this system, the customer handed their card to the clerk at the point of sale, who either swiped the card through a magnetic reader or made an imprint from the raised text on the card. With the magnetic reader, the system verified the account information and printed a slip for the customer to sign. For the imprinted text, the transaction details were filled in and the customer signed the imprinted slip. In both cases, the clerk verified that the customer's signature matched the signature on the back of the card. While being convenient and useful, this system has a number of security flaws, including the ability to copy the card's information, or by reading and writing the magnetic stripe of the card during a transaction, making these cards easy to duplicate and use without the owner's knowledge.

Smart cards (also called EMV chip cards or IC cards) have the ability to store a user's account data on an integrated circuit resident on the credit card. EMV, which stands for Europay, MasterCard, and Visa, was developed as a technical standard for smart cards and for payment terminals and automated teller machines. EMV credit cards utilize the EMV chip to store their data on integrated circuits, as well as on magnetic stripes for backward compatibility. These EMV enabled credit cards can be physically inserted into a card reader or can be read over short distances using radio-frequency identification (RFID) technology, thereby advantageously facilitating secure transactions using cryptographic schemes as implemented by the EMV chip and card reader.

However, the credit cards of today utilize plastic material for the body of the card, as well as to provide the receptacle for holding the EMV chip. In recent years, the desire for more durable card bodies has emerged, in particular metal body credit cards. However, it remains a challenge to safely transfer the EMV chip from the plastic card to a metal card, in particular without damaging the structural and/or functional integrity of the EMV chip. Also, the original plastic card may become damaged during the EMV chip transfer, which can be undesirable. It is also recognised that the type of adhesive used to adhere the EMV chip to the new metal credit card body can be problematic, especially if the adhesive becomes affixed permanently to the top of the EMV chip during its installation into the new metal credit card. Further, there can be a danger with current EMV chip transfer methods, such that the chip itself can be damaged during installation. Further, current transfer methods may result in positioning of the EMV chip such that it extends undesirably above a top surface of the new metal credit card, which risks damage of the transferred EMV chip during use with card readers. Therefore, there remains a need in the art for new transfer methods for EMV chips for credit cards and debit cards.

SUMMARY

It is an object of the present invention to obviate or mitigate at least one of the above presented disadvantages.

An aspect provided is a method for transferring an EMV chip from a first card to a second card, the method comprising the steps of: heating a first body of the first card in a vicinity of the EMV chip so as to weaken adhesion of the EMV chip with a first receptacle of the first body; bending a first body surface of the first body adjacent to the EMV chip, such that first body surface becomes non parallel with a metal contact surface of the EMV chip; removing the EMV chip from the first receptacle; positioning an applied adhesive between a back surface of the EMV chip and an opposing surface of a second receptacle of the second card, the second receptacle in a second body of the second card; and maintaining the EMV chip in the second receptacle until the applied adhesive has cured.

BRIEF DESCRIPTION OF THE DRAWINGS

Exemplary embodiments of the invention will now be described in conjunction with the following drawings, by way of example only, in which:

FIG. 4b is a cross sectional view of the second card of FIG. 2a.

DESCRIPTION

Figure 1A:
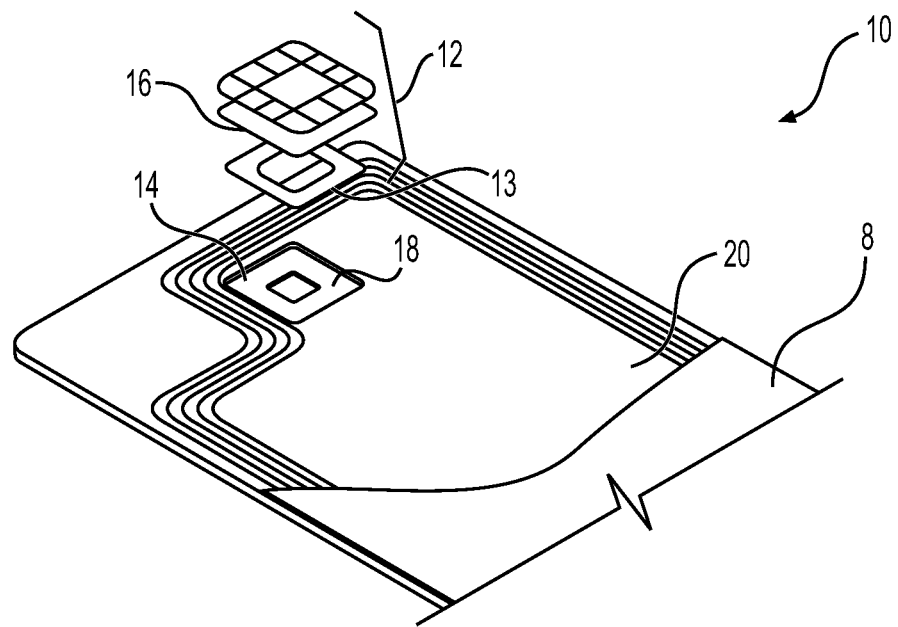
FIG. 1a is a block diagram of components of card.
Figure 1B:
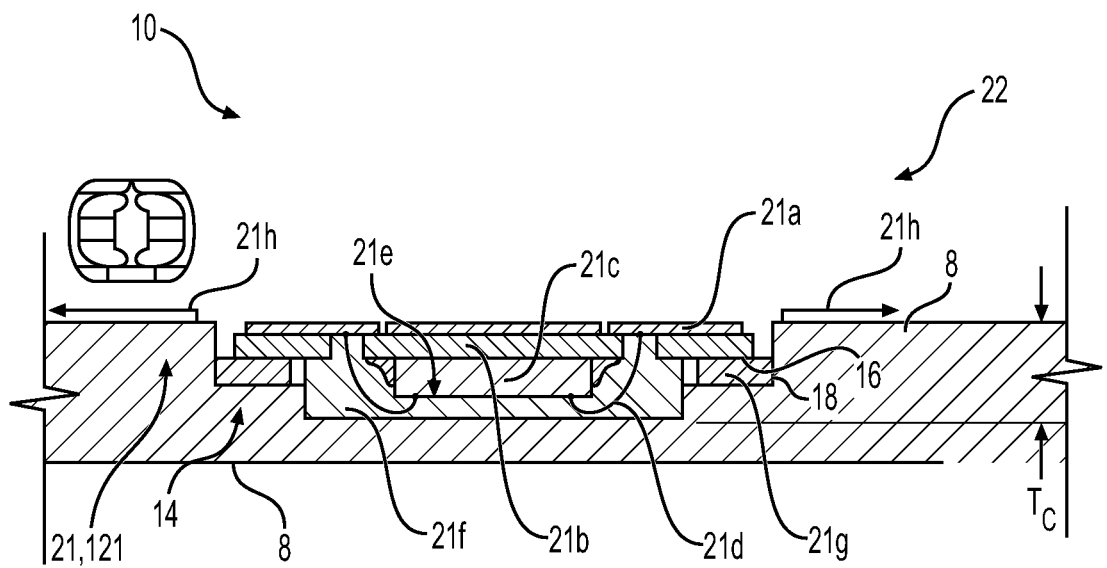
FIG. 1b is a cross sectional view of the card of FIG. 1.

Referring to FIG. 1a, shown is a credit card 10 containing an Europay Mastercard Visa (EMV) chip 12, typically positioned and adhered in an original receptacle 14, see FIG. 1b. For example, the EMV chip 12 has adhesive 13 affixing a back surface 16 to an opposing surface 18 of the original receptacle 14. The credit card 10 has a body 20, composed of plastic material, in which the original receptacle 14 is formed. It is also recognised that the credit card 10 can be a debit card 10. For ease of explanation only, the card 10 will be referred to as a credit card 10.

Referring again to FIGS. 1a,b, the EMV chip 12 is composed of a number of layers 22, namely for example a metal contact layer 21a, a substrate 21b, a chip 21c containing digital circuits (not shown), electrical contacts 21d connecting an active chip side 21e with the metal contact layer 21a, and an encapsulation 21f to house the chip 21c and electrical contacts 21d. Further, adhesive (e.g. hot melt) 21g is used to adhere the back surface 16 to the opposing surface 18 of the original receptacle 14 of the body 20 of the credit card 10.

In general, credit cards 10 that contain EMV chips 12 are easily recognizable by the gold-plated contact pads (e.g. the metal contact layer 21a) featured on the card body 20. In operation, the chip 21c is powered by a reader device (not shown) that the credit card 10 is inserted into. The credit card 10 can also have contactless technology, such as an antenna 11 embedded in the body 20 of the card 10. In general EMV is considered a payment technology while Near Field Communication (NFC) of the antenna 11 is a communication technology that can enable contactless EMV. The three main pieces of data stored in the digital circuits of the chip 21c are: account information (e.g. account number, expiration date); public cryptographic key of the credit card 10; and public cryptographic key of the bank which issued the credit card 10.

Figure 2A:
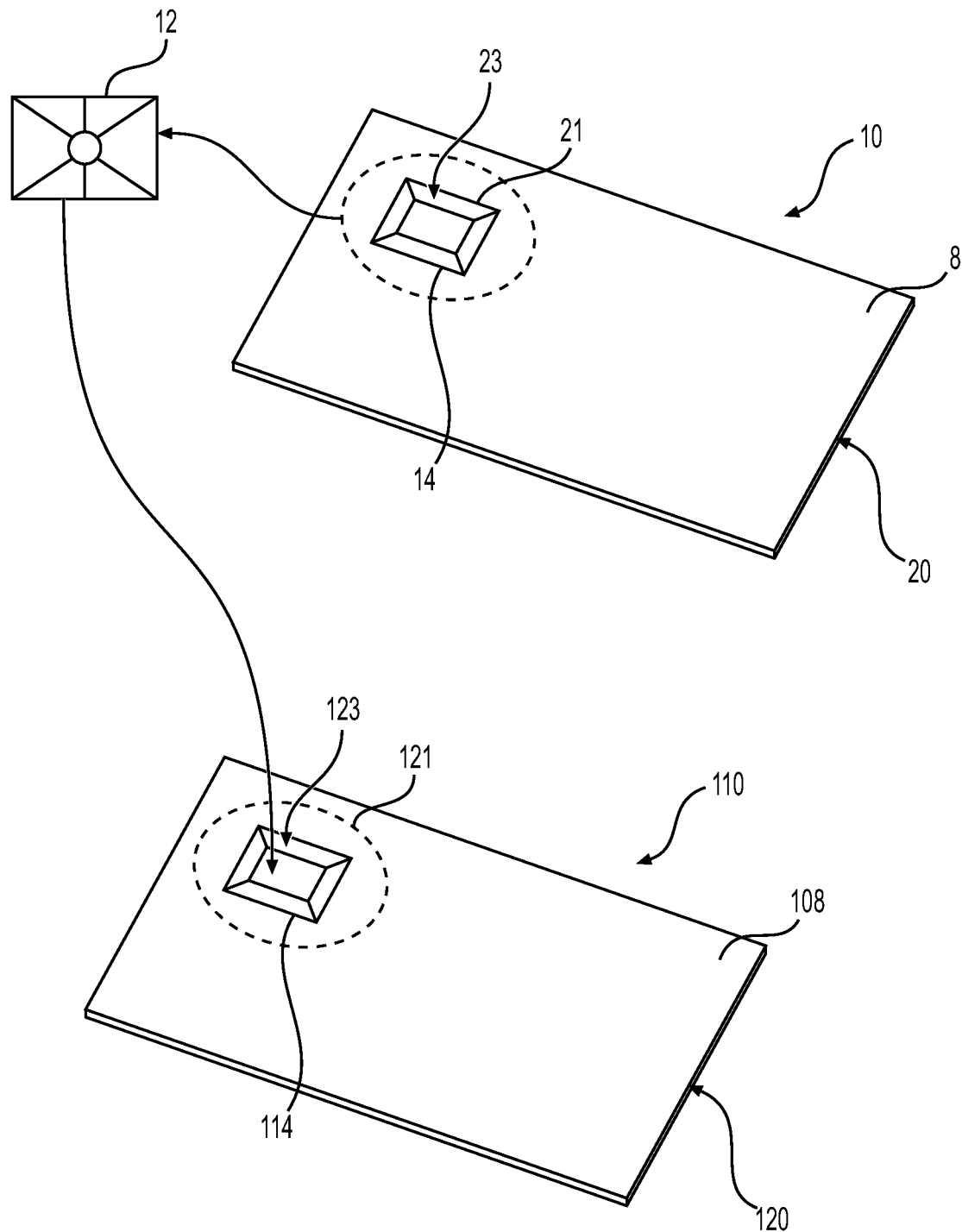
FIG. 2a is example of transferring the EMV chip from the card of FIG. 1.

Referring to FIG. 2a, shown is an overview of removal of the EMV chip 12 from the original receptacle 14 and subsequent installation of the EMV chip 12 into a replacement credit card 110 having a new receptacle 114 and a new body 120. In effect, the EMV chip 12 is transferred from a first credit card 10 to a second credit card 110. In other words, the original receptacle 14 can be referred to as a first receptacle 14 and the new receptacle 114 can be referred to as a second receptacle 114. Further, the original credit card 10 can be referred to as the first credit card 10 and the replacement credit card 110 can be referred to as the second credit card 110. Further, the original body 20 can be referred to as a first body 20 and the new body 120 can be referred to as a second body 120. The first body 20 has a first body surface 21 that extends about an entrance 23 to the first receptacle 14, such that the first body surface 21 extends substantially parallel 21h from the surface of the metal contact layer 21a (see FIG. 1b). Similarly, the second body 120 has a second body surface 121 that extends about an entrance 123 to the second receptacle 114, such that the second body surface 121 extends substantially parallel 21h from the surface of the metal contact layer 21a (depicted notionally using FIG. 1b), once the EMV chip 12 is installed in the second receptacle 114 (see FIG. 5). The first credit card 10 has a first top surface 8 and the second credit card 110 has a second top surface 108. It is also recognised that the second credit card 110 can be a debit card 110. For ease of explanation only, the second card 110 will be referred to as a second credit card 110.

Figure 2B:
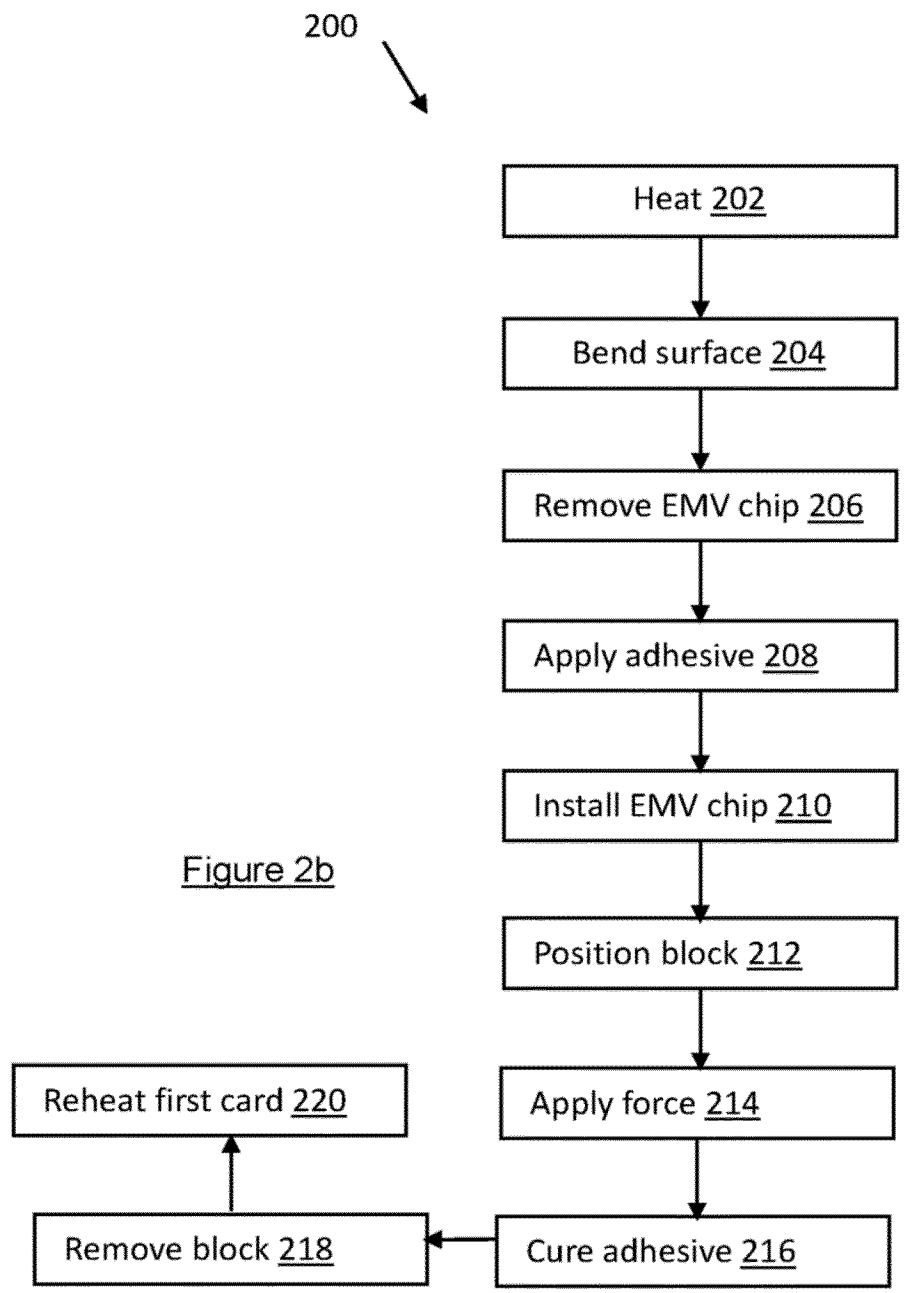
FIG. 2b is an example method for transferring an EMV chip of the card of FIG. 1 to a replacement card.

In view of the above, it is recognised that the EMV chip 12 is transferred from the first credit card 10 to the second credit card 110, as further described below. Referring to FIG. 2b, shown is a block diagram of a process 200 for transferring the EMV chip 12 from the first credit card 10 to the second credit card 110. At step 202, heat is applied (e.g. using a heat gun discharging hot air at about 350 degrees Fahrenheit—not shown) to the first body surface 21 of the body 20. The application of the heat by the heat gun is used to weaken the bond of the adhesive 21g (see FIG. 1b) bonding the substrate 21b to the opposing surface 18 of the first receptacle 14. The application of the heat can also soften the material (i.e. plastic) of the first body 20 about the first receptacle 14. At step 204, the first body surface 21 is bent about the first receptacle 14, e.g. along a crease or fold line 8a that may or may not extend from side to side of the first body 8 (shown by example by ghosted line 8a in FIG. 3), such that the first body surface 21 becomes non parallel 21i with the metal contact layer 21a of the MV chip 12 (see FIGS. 1b, 3).

Referring again to FIG. 3, this non parallel 21i orientation of the first body surface 21, with respect to the metal contact layer 21c, can be done on one or more sides 14a of the first receptacle 14. For example, the bending can be applied to one side 14a of the receptacle 14. For example, the bending can be applied to a pair of opposing sides 15a of the receptacle 14. For example, advantageously, the bending can be applied to a pair of adjacent sides 16a of the receptacle 14. For example, the bending can be applied to three adjacent sides 14a of the receptacle 14. For example, the bending can be applied to all sides 14a of the receptacle 14. It is recognised that multiple fold lines 8a can be simultaneously used on multiple sides 14a of the receptacle 14 in order to weaken the adhesive 21g.

During this step 204, bending of the first body surface 21 about the first receptacle 14 causes a release of adhesion between the substrate 21b and the opposing surface 18 (e.g. structural integrity of the adhesive 21g is broken—see FIGS. 1b, 3), such that the EMV chip 12 can be removed (at step 206) from the first receptacle 14 while at the same time inhibiting material damage to the structural and functional integrity of the chip 21c and metal contact layer 21a. For example, at step 206, the EMV chip 12 can be grabbed by an implement (e.g. tweezers—not shown) and/or manipulated by hand in order to remove the EMV chip 12 from the first receptacle 14. It is considered advantageous to bend the body 20 of the first credit card 10 about the first body surface 21, in order to weaken the adhesive 21g such that damage to the structural and functional integrity of the EMV chip 12 is inhibited during removal of the EMV chip 12 from the first receptacle 14.

Figure 4A:
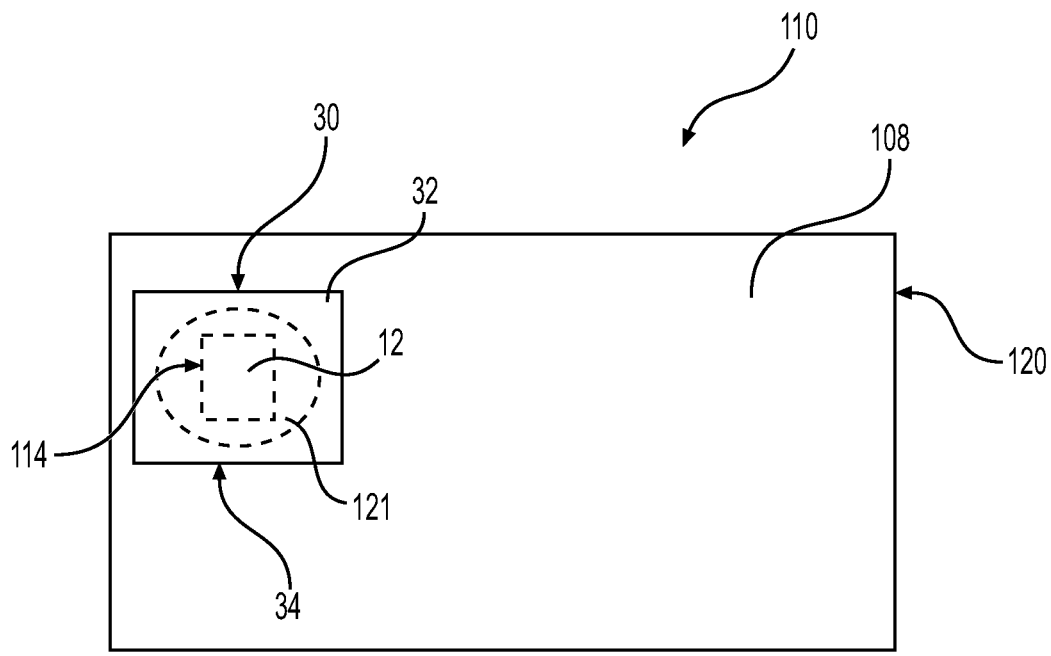
FIGS. 4a,b are further example embodiments of another step of the method of FIG. 2, such that FIG. 4a is a top view
Figure 4B:
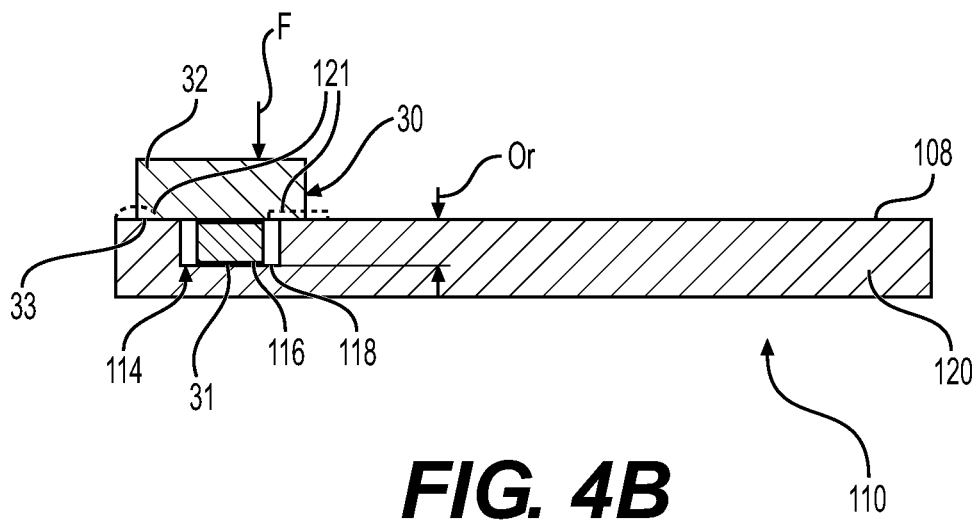
Figure 5:
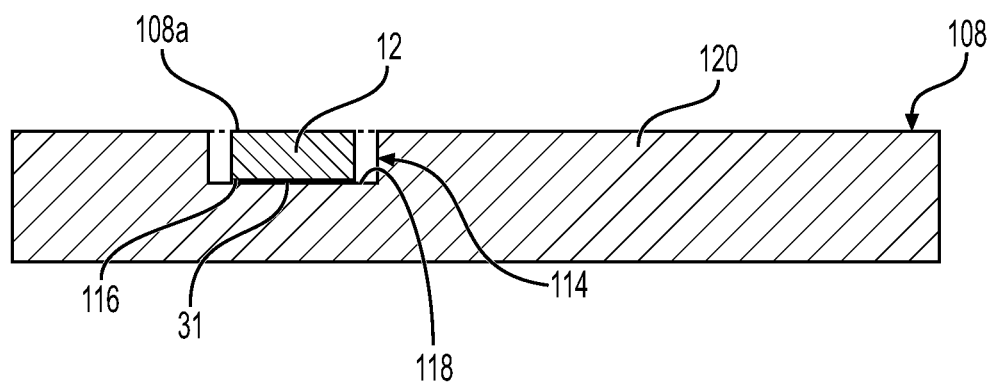
FIG. 5 is an example of an assembled second card of FIG. 2a, such that the EMV chip is installed.

At step 208, an applied adhesive 31 (e.g. SUPER X 8008) is applied on the back surface 116 of the EMV chip 12 and/or to the opposing surface 118 of the second receptacle 114, see FIG. 5 by example. At step 210, the EMV chip 12 is inserted into the second receptacle 114 of the second credit card 110. At step 212, see FIGS. 4a, 4b, a block 30 is positioned on top of the second receptacle 114, such that a peripheral extent 34 of the block 30 overlaps the second body surface 121. In other words, a block body 32 of the block 30 is positioned on a top surface 108 of the second credit card 110, such that the block body 32 covers the metal contact surface 21a (see FIG. 1b) of the EMV chip 12 and the second body surface 121 about the second receptacle 114. In this position, the EMV chip 12 (with applied adhesive 31—see FIG. 4b) is sandwiched between the opposing surface 118 of the second receptacle 114 and the block body 32. It is recognised that the block 30 can be independent of, or part of, a clamping mechanism—not shown as desired.

At step 214, a force F (e.g. via a clamp, via a weight, etc.—not shown) can be applied to the block 30, in order to provide pressure to the surface of the metal contact surface 21a in order to push the EMV chip 12 into the second receptacle 114, such that the metal contact surface 21a is positioned at or below the top surface 108 of the second credit card 110, see FIG. 4b. As such, a bottom surface 33 of the block 30 is in contact with the top surface 108 of the second credit card 110. It is advantageous that the pressure provided by the block 30 be applied to both the metal contact surface 21a and the adjacent second body surface 121 simultaneously, so as to inhibit damage to the EMV chip 12 during installation into the second receptacle 114 as well as to facilitate positioning of the metal contact surface 21a at or below the top surface 108 of the second body 120.

Further, as a thickness Tc (see FIG. 1b) of the EMV chip 12 is less than a depth Dr of the second receptacle 114 (see FIG. 4b), positioning the bottom surface 33 of the block 30 onto the second body surface 121 (adjacent to the opening 123 of the second receptacle 114—see FIG. 2a), facilitates that the EMV chip 12 is not pushed below the top surface 108, such that the bottom surface 116 of the EMV chip 12 contacts the opposing surface 118 of the second receptacle 114 as force F is applied to the block 30. It is recognised that if the bottom surface 116 of the EMV chip 12 is in contact with the opposing surface 118 during application of the force F to the block 30, there could be a risk of undue pressure exerted on the EMV chip 12 itself and thus can become damaged. In other words, in the event that the block extents 34 (see FIG. 4a) did not overlap the second body surface 121 at the same time as being in contact with the metal contact surface 21a, i.e. the block body 32 were to only contact the metal contact surface 21a (see FIG. 1b), then there would be a risk that the EMV chip 12 could become crushed between the block 30 and the opposing surface 118 of the second receptacle 114.

Further, for example, if the metal contact surface 21a would be installed proud (e.g. extending above) of the top surface 108 of the second body 120, then damage to the EMV chip 12 may occur during insertion of the second credit card 110 into card readers (not shown), as the metal contact surface 21a would be undesirably exposed above the top surface 108. It is recognised that this damage to the metal contact layer 21a (and/or to other components of the EMV chip 12) can be due to undesirable impact with fixed slot dimensions of the card reader. As such, it is advantageous that the block 30 contact both the metal contact surface 21a of the EMV chip 12 while at the same time be in contact with the second body surface 121 situated adjacent to (and outside of) the entrance 123 of the second receptacle 114.

It is recognised that the second credit card 110 can be positioned on a supporting surface (e.g. a table, a portion of a clamp), such that the force applied by the block 30 can be used to seat the EMV chip 12 in the second receptacle 114 as desired.

At step 216, the position of the EMV chip 12 in the second receptacle 114 is maintained while the applied adhesive 31 is allowed to cure. For example, the block 30 remains in position (under force) for a predetermined period of time (e.g. 10 minutes) while the applied adhesive 31 cures. At step 218, the block 30 is removed (see FIG. 5) and the second credit card 110 (with installed EMV chip 12 obtained from the first credit card 10) is now ready for use (e.g. to instigate financial transactions with card readers).

Optionally, at step 220, heat (e.g. from the heat gun) can be reapplied to the first body 20 of the first credit card 10, in order to soften the body 20 material and facilitate bending of the first body 20 back into a desired substantially flat configuration. In other words, at step 220 reapplication of heat provides for correction of any warping (and/or induced stresses) of the first body 20 that occurred during step(s) 202, 204.

It is recognised that the second body 120 can be made of a metallic material. It is recognised that the second body 120 can be made of a plastic material. It is recognised that the second body 120 can be made of any material, of a suitable thickness, for protecting the structural and functional integrity of the EMV chip 12 residing in the second receptacle 114. Advantageously, the material of the second body 120 can be metal (e.g. aluminum, steel, etc.), such that durability of the second credit card 110 can be improved over that of the plastic material of the original first credit card 10. Further, the metallic material can facilitate repeated cleaning of the credit card 110 (e.g. using alcohol based products such as hand sanitizer and/or other cleaning products containing virus/bacteria killing chemicals—e.g. bleach), which may otherwise degrade the plastic material of the first credit card 110 over time. Further, it is advantageous to utilize the top surface 108 of the second body to have graphics/designs that provide for customization of the look of the second credit card 110. It is recognised that the second body 120 can be customized to contain graphics/designs, either applied to the top surface 108 of the second body 120 and/or embedded in the material of the second body 120 (e.g. during manufacture of the second body 120), while the second receptacle 114 is empty (i.e. before installation of the EMV chip 12 therein). This ability for customization of the second body 120 before installation of the EMV chip 12 inhibits damage to the EMV chip 12.

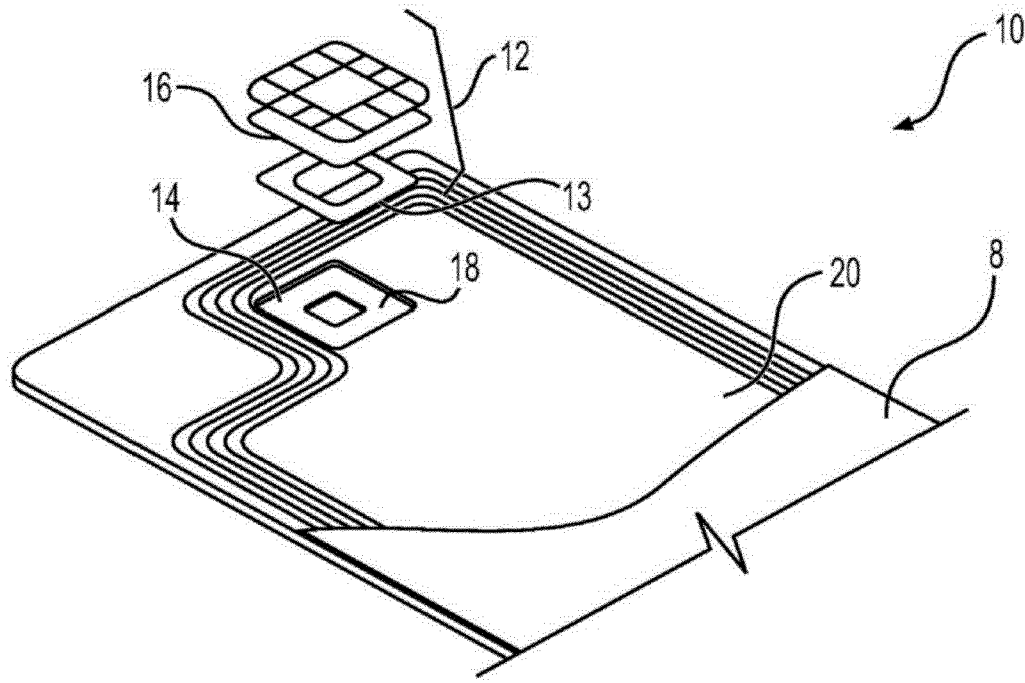

I claim:

1. A method for transferring an EMV chip from a first card to a second card, the method comprising the steps of:

obtaining the first card having the EMV chip itself bonded directly to a first body of the first card in a first receptacle thereby making a bond directly between the EMV chip and the first body, an adhesive being used to fixedly secure the EMV chip to provide said bond, said adhesive needing applied heat in order to subsequently weaken said bond once adhered, the adhesive affixing a back surface of the EMV chip with an opposing surface of the first body in the first receptacle, the first body having a first body surface substantially parallel with a planar top surface of the EMV chip;

heating the first body of the first card in a vicinity of the EMV chip so as to cause a weakening in the adhesive of said bond of the EMV chip with the first body as well as a softening of the first body about an entrance of the first receptacle, the first body extending around the first receptacle in order to form the receptacle;

bending the first body surface of the first body adjacent to the EMV chip, such that first body surface adjacent to the first receptacle becomes non parallel with the planar top surface of the EMV chip, the planar top surface having a metal contact surface, said bending causing a release of said bond between the back surface and the opposing surface;

removing the EMV chip from the first receptacle while the top surface remains bent and while maintaining a structural integrity of the EMV chip including the planar top surface;

positioning an applied adhesive between the back surface of the EMV chip and an opposing surface of a second receptacle of the second card, the second receptacle in a second body of the second card the EMV chip retaining the planar top surface in order to continue to maintain the structure integrity of the EMV chip when positioned in the second receptacle; and maintaining the EMV chip in the second receptacle until the applied adhesive has cured.

2. The method of claim 1 further comprising the step of sandwiching the EMV chip between a block and the opposing surface of the second receptacle, such that a block body of the block overlaps both the EMV chip and a second body surface of the second body, the second body surface extending about the second receptacle.

3. The method of claim 2, wherein the second body surface is part of a top surface of the second body of the second card.

4. The method of claim 2 further comprising applying a force to the block body, in order to provide a pressure simultaneously to both the second body surface and the EMV chip.

5. The method of claim 1, wherein the applied adhesive is SUPER X 8008.

6. The method of claim 1 further comprising the step of applying heat to the first body of the first card in order to reduce warping of the first body introduced during at least one of said heating and said bending.

7. The method of claim 1 further comprising the step of applying heat to the first body of the first card in order to reduce stresses in the first body introduced during at least one of said heating and said bending.

8. The method of claim 1, wherein said bending is applied on at least one side of the receptacle.

9. The method of claim 1, wherein said bending is applied on a pair of opposing sides of the receptacle.

10. The method of claim 1, wherein said bending is applied on a pair of adjacent sides of the receptacle.

11. The method of claim 1, wherein the first body is composed of a plastic material and the second body is composed of a metallic material.

12. The method of claim 1, wherein the card is a credit card.

13. The method of claim 1, wherein the card is a debit card.

* * * * *

UNITED STATES PATENT AND TRADEMARK OFFICE
CERTIFICATE OF CORRECTION

| | |
|---|---|
| PATENT NO. | : 11,157,790 B1 |
| APPLICATION NO. | : 17/007833 |
| DATED | : October 26, 2021 |
| INVENTOR(S) | : Andre Santos |

It is certified that error appears in the above-identified patent and that said Letters Patent is hereby corrected as shown below:

On the Title Page

Replace the title page with the attached title page, showing the corrected number of drawing sheets.

In the Drawings

Figure 3:
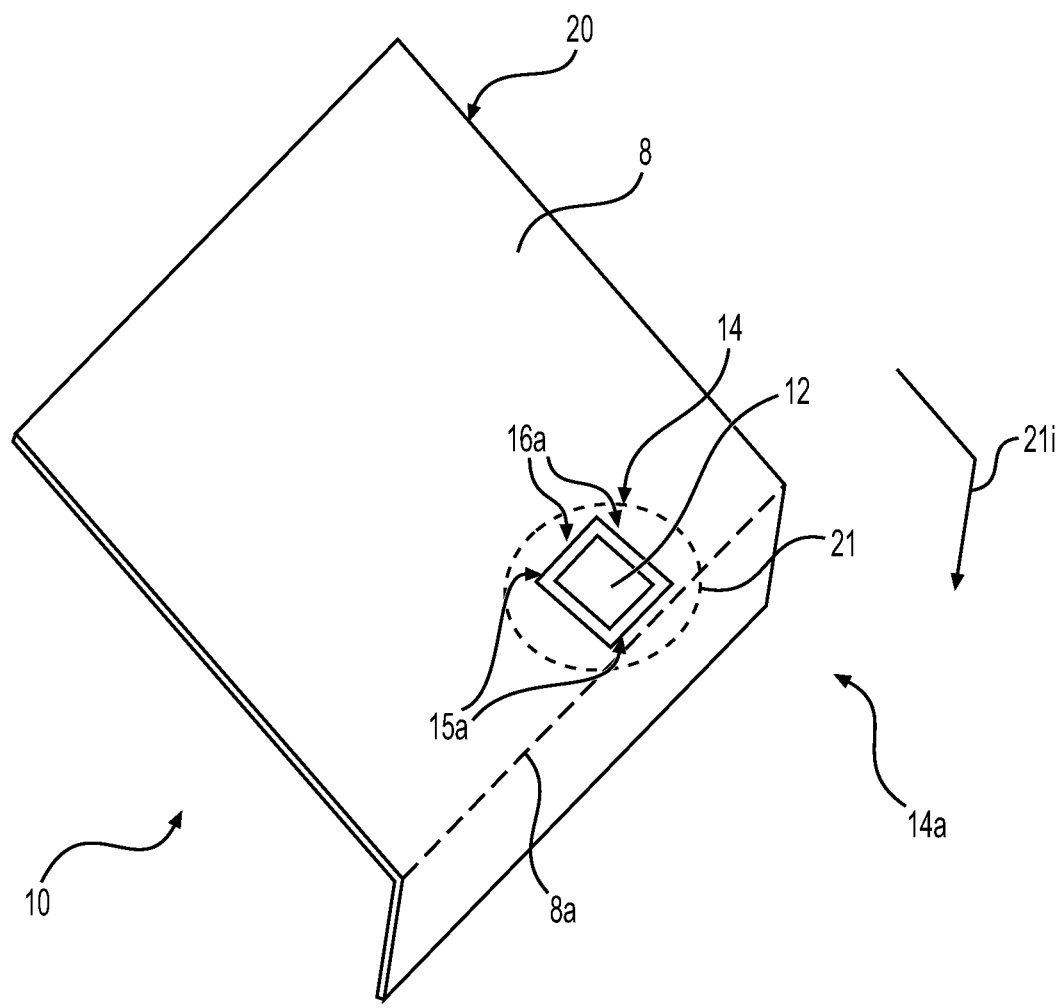
FIG. 3 is an example embodiment for a step of the method of FIG. 2.

Figure 2B should be inserted after Figure 2A and before Figure 3.

Signed and Sealed this
Twenty-third Day of May, 2023

Katherine Kelly Vidal
*Director of the United States Patent and Trademark Office*

(12) United States Patent
Santos

(10) Patent No.: US 11,157,790 B1
(45) Date of Patent: Oct. 26, 2021

(54) SYSTEM AND METHOD FOR TRANSFERRING AN EMV CHIP FROM A FIRST CARD TO A SECOND CARD

(71) Applicant: Andre Santos, Woodbridge (CA)

(72) Inventor: Andre Santos, Woodbridge (CA)

(73) Assignees: Christian Smilynov, Woodbridge (CA); Andre Santos, Woodbridge (CA)

(*) Notice: Subject to any disclaimer, the term of this patent is extended or adjusted under 35 U.S.C. 154(b) by 0 days.

(21) Appl. No.: 17/007,833

(22) Filed: Aug. 31, 2020

(51) Int. Cl.
*G06K 19/077* (2006.01)

(52) U.S. Cl.
CPC .............................. *G06K 19/07745* (2013.01)

(58) Field of Classification Search
CPC .................................................. G06K 19/07745
USPC .................................................. 235/492, 487
See application file for complete search history.

(56) References Cited

U.S. PATENT DOCUMENTS

| | | | | |
|---|---|---|---|---|
| 4,947,531 A * | 8/1990 | Brisson | ............ | G06K 19/07745 29/446 |
| 5,508,107 A * | 4/1996 | Gutman | ............ | C09J 7/385 428/339 |
| 5,581,065 A * | 12/1996 | Nishikawa | ............ | G06K 19/072 235/487 |
| 5,677,524 A * | 10/1997 | Haghiri-Tehrani | ............ | G06K 19/077 235/487 |
| 5,975,584 A * | 11/1999 | Vogt | ............ | G06K 13/077 283/100 |
| 2008/0206520 A1* | 8/2008 | Il | ............ | C23C 26/00 428/172 |
| 2011/0315779 A1* | 12/2011 | Bidin | ............ | H01L 23/49855 235/492 |
| 2019/0010613 A1* | 1/2019 | Shoji | ............ | C23C 2/40 |
| 2019/0272457 A1* | 9/2019 | Vu | ............ | G06K 19/0772 |

* cited by examiner

*Primary Examiner* — Allyson N Trail

(57) ABSTRACT

A method for transferring an EMV chip from a first card to a second card, the method comprising the steps of: heating a first body of the first card in a vicinity of the EMV chip so as to weaken adhesion of the EMV chip with a first receptacle of the first body; bending a first body surface of the first body adjacent to the EMV chip, such that first body surface becomes non parallel with a metal contact surface of the EMV chip; removing the EMV chip from the first receptacle; positioning an applied adhesive between a back surface of the EMV chip and an opposing surface of a second receptacle of the second card, the second receptacle in a second body of the second card; and maintaining the EMV chip in the second receptacle until the applied adhesive has cured.

13 Claims, 6 Drawing Sheets